United States Patent
Vadi et al.

(10) Patent No.: US 6,975,145 B1
(45) Date of Patent: Dec. 13, 2005

(54) GLITCHLESS DYNAMIC MULTIPLEXER WITH SYNCHRONOUS AND ASYNCHRONOUS CONTROLS

(75) Inventors: Vasisht M. Vadi, Mountain View, CA (US); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/453,235

(22) Filed: Jun. 2, 2003

(51) Int. Cl.[7] ............................ H03K 17/00; H03K 3/00
(52) U.S. Cl. ............................................ 327/99; 327/298
(58) Field of Search ........................... 327/99, 298, 407, 327/291, 293, 294, 296, 297; 713/501

(56) References Cited

U.S. PATENT DOCUMENTS

| | | | |
|---|---|---|---|
| 4,635,249 A | 1/1987 | Bortolini et al. ............ 370/217 |
| 5,231,636 A | 7/1993 | Rasmussen ................ 327/387 |
| 5,254,888 A * | 10/1993 | Lee et al. ................... 327/298 |
| 5,483,185 A * | 1/1996 | Scriber et al. ............... 327/99 |
| 5,604,452 A * | 2/1997 | Huang ......................... 327/99 |
| 5,623,223 A | 4/1997 | Pasqualini .................. 327/298 |
| 6,204,695 B1 | 3/2001 | Alfke et al. .................. 326/93 |
| 6,239,626 B1 * | 5/2001 | Chesavage ................... 327/99 |
| 6,266,780 B1 | 7/2001 | Grundvig et al. ........... 713/501 |
| 6,275,546 B1 | 8/2001 | Miller et al. ................ 375/354 |
| 6,348,828 B1 | 2/2002 | Barnes ........................ 327/298 |
| 6,369,636 B1 * | 4/2002 | Li .............................. 327/407 |
| 6,429,698 B1 | 8/2002 | Young .......................... 327/99 |
| 6,453,425 B1 * | 9/2002 | Hede et al. .................. 713/501 |
| 6,472,909 B1 | 10/2002 | Young .......................... 327/99 |
| 6,501,304 B1 | 12/2002 | Boerstler et al. ............ 327/99 |
| 6,593,780 B2 * | 7/2003 | Lammers ..................... 327/99 |
| 6,600,345 B1 * | 7/2003 | Boutaud ....................... 327/99 |
| 6,600,355 B1 * | 7/2003 | Nguyen ....................... 327/298 |
| 6,653,867 B1 * | 11/2003 | Shihadeh ...................... 326/96 |
| 6,759,881 B2 * | 7/2004 | Kizer et al. ................. 327/147 |

OTHER PUBLICATIONS

"Modern Dictionary of Electronics" by Rudolf F. Graf.*
U.S. Appl. No. 10/436,781, filed May 12, 2003, Kaviani et al.

* cited by examiner

*Primary Examiner*—Tuan T. Lam
(74) *Attorney, Agent, or Firm*—Arthur J. Behiel; LeRoy D. Maunu (57) ABSTRACT

Described are glitchless clock control circuits capable of switching away from a failed clock. One embodiment supports three basic functions: clock select, clock enable, and clock ignore. The clock-select function provides a selected one of a plurality of clock signals on a clock-distribution node. The select signals used to switch between clock signals need to be synchronous with any of the clock signals. The clock-enable function allows the clock control circuit to synchronously block or pass a selected clock signal. Finally, the clock-ignore function allows the clock control circuit to ignore a selected clock if necessary, for example, to switch away from a failed clock.

18 Claims, 7 Drawing Sheets

GLITCHLESS DYNAMIC MULTIPLEXER WITH SYNCHRONOUS AND ASYNCHRONOUS CONTROLS

FIELD OF INVENTION

The present invention relates in general to circuits for selecting from among multiple clock signals.

BACKGROUND

Synchronous circuits rely on precisely synchronized event timing for error-free execution of complex synchronous functions. Accordingly, a single clock signal is often used as a reference to synchronize related events in a given process. The power required to distribute such a clock signal throughout a given circuit represents a significant percentage of the circuit's power requirement, particularly if the clock signal is of a relatively high frequency.

Some processes do not require a continuous, high-speed clock signal. In such cases, providing a high-speed clock signal regardless of need unnecessarily wastes power. Some circuits address this waste with a clock multiplexer that allows the clock-distribution network to distribute a reduced-speed clock in place of the primary clock when speed performance is not required. Other circuits further reduce power consumption by preventing the routing of the primary clock signal when the high-speed clock is not required. Alfke et al. describe one such clock gating circuit in commonly owned U.S. Pat. No. 6,204,695, which issued Mar. 20, 2001.

Reducing power consumption is just one reason for providing a switched clock. Some circuit may have to operate in response to two or more separate clock signals. For example, integrated circuits that operate in accordance with the proposed PCI-X bus interface standard must be able to operate in response to either a 133 MHz clock signal or a 66 MHz clock signal.

Figure 1A:
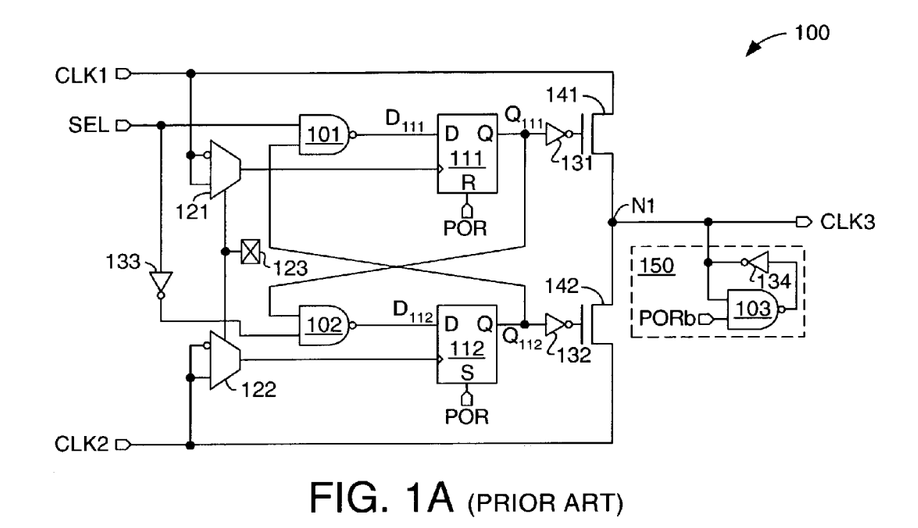
FIG. 1A (prior art) depicts a two-to-one clock selection circuit that provides either of two clock signals CLK1 and CLK2 on a clock-distribution node CLK3.

FIG. 1A (prior art) depicts a two-to-one clock selection circuit 100 that provides either of two clock signals CLK1 and CLK2 on a clock-distribution node CLK3, and advantageously switches between those two clock signals without generating a glitch on node CLK3. (As with other designations herein, CLK1, CLK2, and CLK3 each refer both to a signal and its corresponding node; whether a given designation refers to a signal or a node will be clear from the context.)

Clock selection circuit 100 includes NAND gates 101–103, D-type flip-flops 111 and 112, 2-to-1 multiplexers 121 and 122, a configuration memory cell 123, inverters 131–134, and n-channel pass transistors 141 and 142. Inverter 134 and NAND gate 103 are connected to form keeper circuit 150.

Clock signal CLK1 is applied to inverting and non-inverting input terminals of multiplexer 121. Multiplexer 121 is controlled by a configuration value stored in configuration memory cell 123. Thus, if configuration memory cell 123 stores a logic "0" value, then multiplexer 121 routes the inverse of clock signal CLK1 (i.e., CLK1b). Conversely, if configuration memory cell 123 stores a logic "1" value, then multiplexer 121 routes the clock signal CLK1. The output terminal of multiplexer 121 is coupled to the clock input terminal of flip-flop 111. In the described embodiment, flip-flop 111 is a rising edge triggered flip-flop. As described below, multiplexer 121 effectively enables flip-flop 111 to be triggered by either the rising edges or the falling edges of the CLK1 signal.

A second clock signal CLK2 is applied to inverting and non-inverting input terminals of multiplexer 122. Multiplexer 122 is also controlled by a configuration value stored in configuration memory cell 123. Thus, if configuration memory cell 123 stores a logic "0" value, then multiplexer 122 routes the inverse of clock signal CLK2 (i.e., CLK2b). Conversely, if configuration memory cell 123 stores a logic "1" value, then multiplexer 122 routes the clock signal CLK2. The output terminal of multiplexer 122 is coupled to the clock input terminal of flip-flop 112. In the described embodiment, flip-flop 112 is a rising edge triggered flip-flop. As described in more detail below, multiplexer 122 effectively enables flip-flop 112 to be triggered by either the rising edges or the falling edges of the CLK2 signal.

A clock select signal SEL is provided to an input terminal of NAND gate 101. The Q output terminal of flip-flop 112, which carries output signal $Q_{112}$, is coupled to the other input terminal of NAND gate 101. The clock select signal SEL is also provided to inverter 133. In response, inverter 133 provides the inverse of the clock select signal SEL to an input terminal of NAND gate 102. The Q output terminal of flip-flop 111, which carries output signal $Q_{111}$, is coupled to the other input terminal of NAND gate 102.

NAND gate 101 provides input signal $D_{111}$ to the D input terminal of flip-flop 111. NAND gate 102 provides input signal $D_{112}$ to the D input terminal of flip-flop 112. Flip-flop 111 has a reset input terminal (R) coupled to receive a power-on-reset signal POR. Flip-flop 112 has a set input terminal (S) coupled to receive the power-on-reset signal POR.

The output terminals of flip-flops 111 and 112 are further connected to input terminals of inverters 131 and 132, respectively. The output terminals of inverters 131 and 132 are coupled to gate electrodes of pass transistors 141 and 142, respectively. The CLK1 and CLK2 signals are provided to the drain terminals of pass transistors 141 and 142, respectively. The source terminals of pass transistors 141 and 142 are commonly connected to node N1. The signal on node N1 is provided as the output clock signal CLK3.

Node N1 is further coupled to an input terminal of NAND gate 103. The other input terminal of NAND gate 103 is coupled to receive the inverse of the POR signal (i.e., PORb). The output terminal of NAND gate 103 is connected to the input terminal of inverter 134. The output terminal of inverter 134 is connected to node N1. When the PORb signal has a logic high value, NAND gate 103 is configured as an inverter. Under these conditions, NAND gate 103 and inverter 134 form a keeper circuit that is capable of holding the state of the signal on node N1. Note that inverter 134 and NAND gate 103 are designed to be weak relative to pass transistors 141 and 142. As a result, when clock signals CLK1 and CLK2 are driven onto node N1, these clock signals can easily change the state of node N1. For a more detailed description of clock selection circuit 100, see U.S. Pat. No. 6,429,698 to Steven P. Young, issued Aug. 6, 2002, which is incorporated herein by reference.

Clock selection circuit 100 works well in many applications, but has two potential shortcomings. First, switching between clocks requires each of flip-flops 111 and 112 to change state, which in turn requires each flip-flop 111 and 112 to be clocked by respective clock signals CLK1 and CLK2. Clock selection circuit 100 is therefore incapable of switching between clock sources unless both clock sources are producing edges. If, for example, clock signal CLK1 were to fail, selection circuit 100 would be unable to switch to clock signal CLK2. Second, the switching of the selection circuit to CLK2 from CLK1, after the SEL signal, happens only after the CLK1 edge (and the CLK2 edge), which may be undesirable in some applications.

Figure 1B:
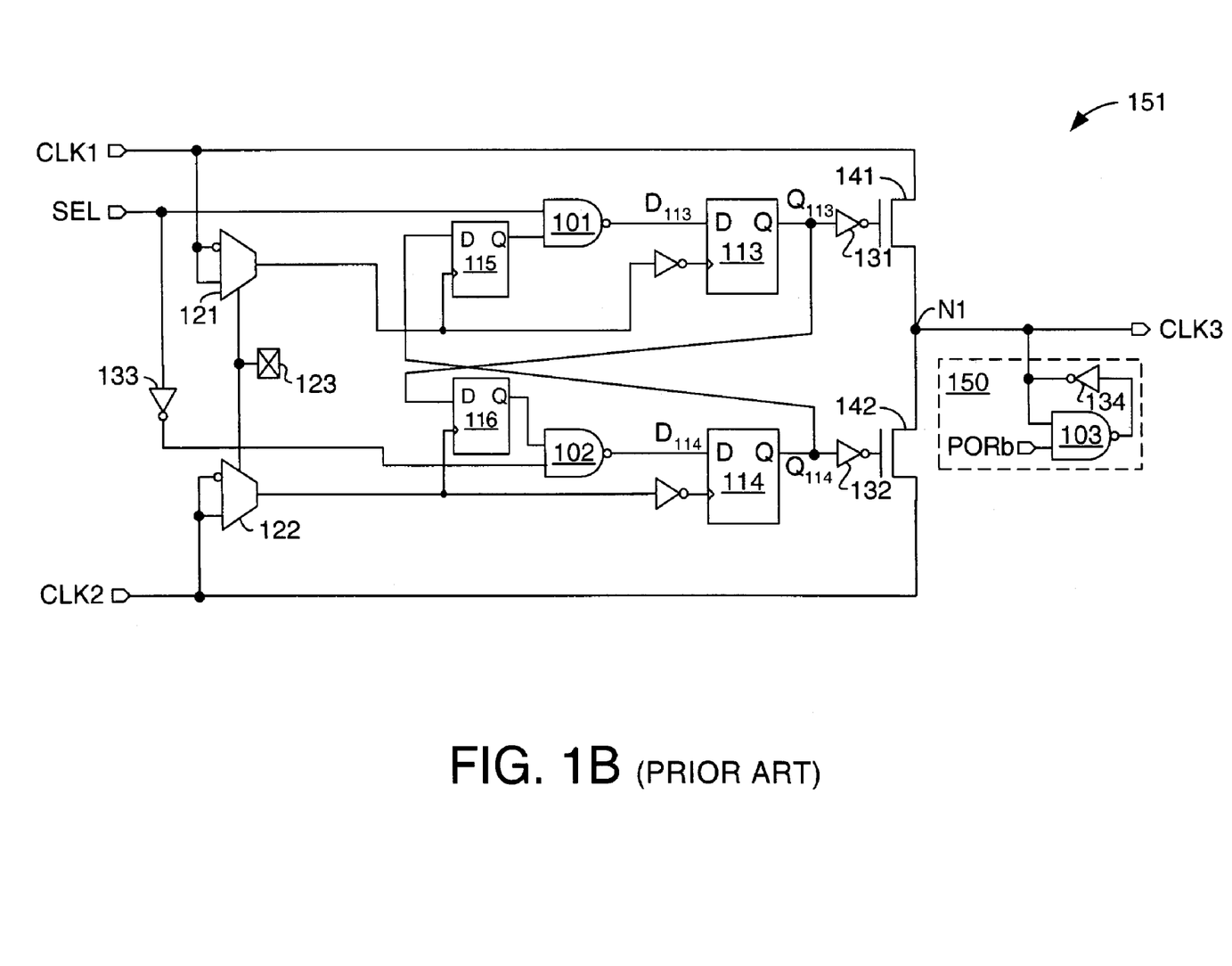
FIG. 1B (prior art) depicts another two-to-one clock selection circuit that provides either of two clock signals CLK1 and CLK2 on a clock-distribution node CLK3.

FIG. 1B (prior art) depicts another two-to-one clock selection circuit 151 that provides either of two clock signals CLK1 and CLK2 on a clock-distribution node CLK3, and advantageously switches between those two clock signals without generating a glitch on node CLK3. FIG. 1B has several similarities to FIG. 1A and where the similarities occur the labels are kept the same. FIG. 1B has, however, master-slave latches, i.e., latches 115 and 116 (master) and latches 113 and 114 (slave), instead of flip-flops 111 and 112. Also, the NAND gates 101 and 102 are now between the master and slave latches. In circuit 151 an edge on the first clock is not needed to switch away from the first clock, because the SEL signal is connected to the slave latches. The first clock need only be at the correct level to open the gate of the latch. However, in order to prevent glitches, there must be proper set-up and hold times between the clock signals and the select signal. Circuit 151 is an improvement over circuit 100 in that circuit 151 prevents switching of clocks, when one clock fails, in fewer cases than circuit 100. Circuit 151 also has the advantage of switching immediately away from the first clock as long as the set-up time is met and this may be desirable for some applications. However, the disadvantage is that one must be in the right state for circuit 151 to allow a switch of clocks to occur, and matching the right state of circuit 151 with a clock failure may be difficult for some applications.

There is therefore a need for an improved glitchless clock selection circuit that is capable of switching away from a failed clock, and for which there is no set-up or hold time requirement for the select signal.

SUMMARY

The present invention addresses the need for a glitchless clock control circuit capable of switching away from a failed clock. A clock control circuit in accordance with one embodiment supports three basic functions: clock select, clock enable, and clock ignore. The clock-select function provides a selected one of a plurality of clock signals on a clock output node. The select signals used to switch between clock signals need not be synchronous with any of the clock signals. The clock-enable function allows the clock control circuit to synchronously block or pass a selected clock signal. Finally, the clock-ignore function allows the clock control circuit to ignore a selected clock if necessary, for example, to switch away from a failed clock.

This summary does not limit the invention, which is instead defined by the claims.

DETAILED DESCRIPTION

Figure 2:
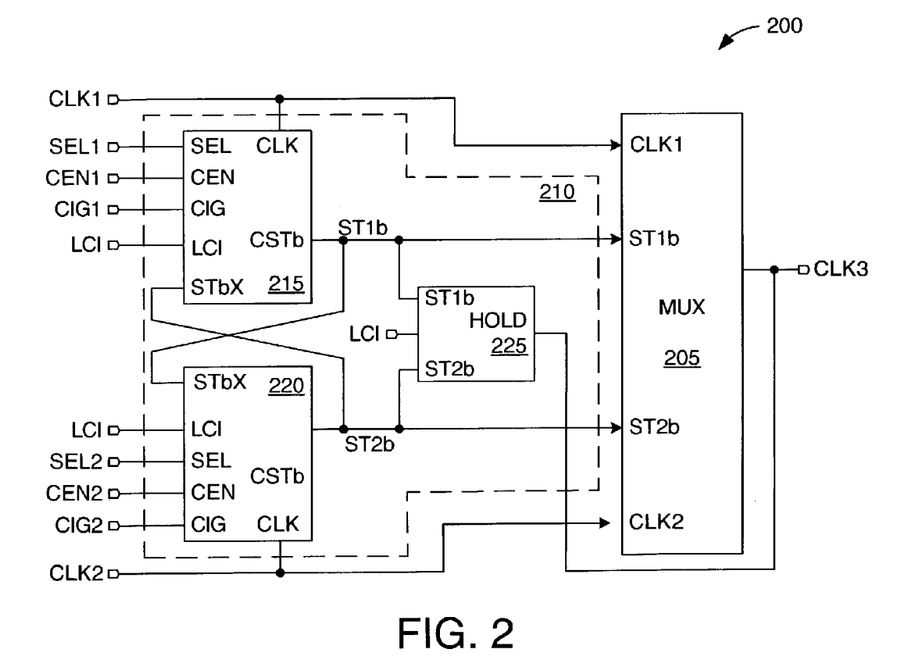
FIG. 2 depicts a clock-control circuit in accordance with one embodiment of the invention.

FIG. 2 depicts a clock-control circuit 200 in accordance with one embodiment of the invention. Control circuit 200 includes a multiplexer 205 that passes one or neither of a pair of clock signals CLK1 and CLK2 in response to a pair of state signals ST1b and ST2b from some control logic 210. Clock-control circuit 200 switches between clock signals CLK1 and CLK2 without introducing glitches in output signal CLK3, includes clock-ignore capability that facilitates switching away from failed clocks, and supports independent clock-enable functionality for clock signals CLK1 and CLK2. These and other advantages are obtained with minimal increases in area and power consumption.

Clock-control circuit 200 supports three basic functions: clock select, clock enable, and clock ignore. The clock-select function provides a selected one of clock signals CLK1 and CLK2 on clock-distribution node CLK3 in response to select signals SEL1 and SEL2. The clock-enable function allows control circuit 200 to synchronously block or pass a selected clock signal. If clock-signal CLK1 is selected, for example, clock-enable signal CEN1 can be used to synchronously switch on and off the clock signal provided on clock-distribution node CLK3. Finally, the clock-ignore function allows control logic 210 to ignore either of clock signals CLK1 and CLK2 if necessary, for example, to switch away from a failed clock.

Control logic 210 includes identical first and second clock-state generators 215 and 220 and a hold circuit 225. State generators 215 and 220 generates state signals ST1b and ST2b in response to the externally provided select, clock-enable, and clock-ignore signals introduced above, while hold circuit 225 holds clock-distribution node CLK3 at a predefined logic level during switching and when neither clock signal is selected. An additional control signal, latch-clock-invert LCI, determines the predefined logic level of hold circuit 225.

Select Function

Asserting select signal SEL1 with signal SEL2 de-asserted connects clock signal CLK1 to clock-distribution node CLK3; asserting select signal SEL2 with signal SELL de-asserted connects clock signal CLK2 to clock-distribution node CLK3; and de-asserting both select signals holds clock-distribution node CLK3 in a given state (simultaneously holding both signals SEL1 and SEL2 to logic one is not allowed). The following describes how control circuit 200 switches from clock signal CLK1 to clock signal CLK2.

The process of switching back from clock signal CLK2 to clock signal CLK1 is identical, so a description of that process is omitted for brevity.

Select signal SEL1 is asserted and SEL2 de-asserted to select clock signal CLK1. Control circuit 200 delivers clock signal CLK1 via node CLK3 as long as the control signals remain unchanged. This example assumes clock-enable signals CEN1 and CEN2 are asserted, clock-ignore signals CIG1 and CIG2 are de-asserted, and latch-clock-invert signal LCI is de-asserted. Table 1, below, summarizes the select function as control circuit 200 switches between clock signal

TABLE 1

| SEL1 | SEL2 | CLK1 | CLK2 | ST1b | ST2b | CLK3 |
|------|------|------|------|------|------|------|
| 1 | 0 | — | — | 0 | 1 | CLK1 |
| 0 | 0 | F | — | 1 | 1 | Hold |
| 0 | 1 | — | F | 1 | 0 | CLK2 |
| 0 | 0 | — | F | 1 | 1 | Hold |
| 1 | 0 | F | — | 0 | 1 | CLK1 |

The first row of Table 1 shows that with select signals SEL1 and SEL2 respectively asserted (high) and de-asserted (low), active-low state signals ST1b and ST2b are likewise respectively asserted (low) and de-asserted (high). Multiplexer 205 therefore provides input clock signal CLK1 on output node CLK3.

The switch from clock signal CLK1 to clock signal CLK2 begins when select signal SELL is de-asserted (Table 1, second row). Control logic 210 synchronizes the de-assertion of select signal SEL1 with clock signal CLK1 by de-asserting state signal ST1b in response to the next falling edge F of clock signal CLK1. Multiplexer 205 responds by disconnecting terminal CLK1 from clock node CLK3, which leaves clock node CLK3 floating. Hold circuit 225 responds to the two de-asserted state signals ST1b and ST2b by holding the floating node CLK3 to a predetermined logic level. Given that signal LCI is assumed to be logic zero in this example, control logic 210 switches multiplexer 205 away from clock signal CLK1 when clock signal CLK1 transitions to a logic zero. Hold circuit 225 then maintains this level, and thus prevents a glitch on node CLK3. If signal LCI is a logic one, control logic 210 switches multiplexer 205 away from a selected clock signal on the next rising edge of the selected clock signal, and hold circuit 225 holds node CLK3 to a logic one during transitions between clock signals.

Control logic 210 remains in state 11 (ST1b=1; ST2B=1) until select signal SEL2 asserted (Table 1, third row). Control logic 210 synchronizes the assertion of select signal SEL2 with clock signal CLK2, asserting state signal ST2b (low) in response to the next falling edge F of clock signal CLK2 (clock signal CLK1 is a "don't care"). Hold circuit 225 disconnects its output from clock node CLK3 as multiplexer 205 conveys clock signal CLK2 to node CLK3. (Control logic 210 switches from the logic zero of hold circuit 225 to clock signal CLK2 when clock signal CLK2 is a logic zero, preventing a glitch on node CLK3.)

In the foregoing example, both select signals SEL1 and SEL2 are de-asserted (i.e., 00) when switching between clock CLK1 and clock CLK2. In practice, select signals SEL1 and SEL2 can be complementary signals, in which case only one of them can be de-asserted at a time. Control logic 210 still enters hold state 11, when switching between states 01 (select clock CLK1) and 10 (select clock CLK2).

Clock-Enable Function

Whichever of clock signals CLK1 and CLK2 is selected, the respective one of clock-enable signals CEN1 and CEN2 can be used to synchronously start and stop the output clock signal on node CLK3. Each clock-enable signal CEN1 and CEN2 is synchronous with respect to the associated clock signal, and is thus timed to meet the set-up and hold time requirements of respective clock-state generators 215 and 220.

Clock-Ignore Function

Control logic 210 synchronizes select signals SELL and SEL2 with corresponding clock signals CLK1 and CLK2. When switching away from clock signal CLK1, for example, control logic 210 awaits the arrival of a clock edge on clock terminal CLK1 before de-asserting (high) state signal ST1b to switch away from clock signal CLK1. Because control logic 210 awaits a clock edge before switching away from clock signal CLK1, control logic 210 cannot switch away from a failed (non-transitioning) clock by simply de-asserting the corresponding select signal.

Each of clock-state generators 215 and 220 receives a corresponding clock-ignore signal CIG1 and CIG2. Asserting a clock-ignore signal renders the associated sub-block transparent, so select signals propagate directly through the sub-block in the absence of a clock. When clock-ignore signal CIG1 is asserted, for example, de-asserting select signal SEL1 causes state signal ST1b to transition to a logic one regardless of whether clock signal CLK1 transitions. Clock ignore terminal CIG1 thus enables clock-control circuit 200 to transition away from a failed clock. The assertion of a clock-ignore signal does not alter the logical operation of select signals SEL1 and SEL2, which still function as summarized above in connection with Table 1.

Figure 3:
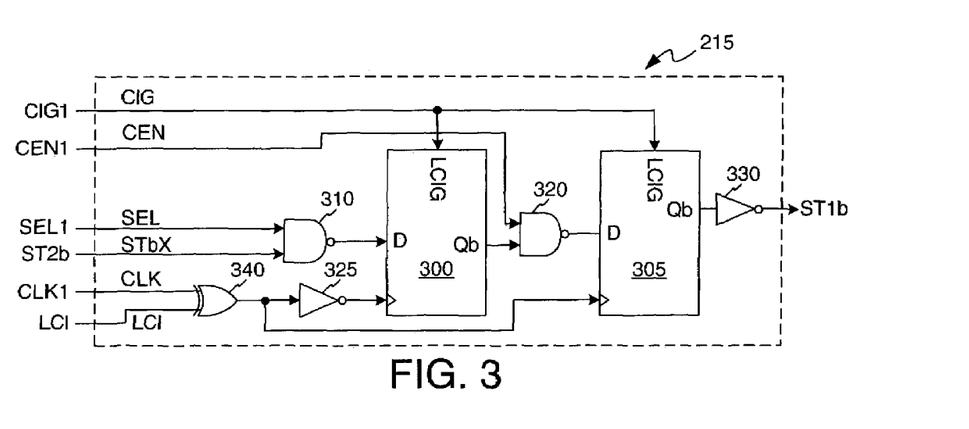
FIG. 3 details an embodiment of clock-state generator of FIG. 2.

FIG. 3 details an embodiment of clock-state generator 215 of FIG. 2, which includes a series of two low-level-triggered latches 300 and 305, a pair of NAND gate 310 and 320, a pair of inverters 325 and 330, and an XOR gate 340. Clock-state generator 220 is identical generator 215, so a detailed discussion of generator 220 is omitted for brevity.

State generator 215 is, in essence, a configurable flip-flop. Select terminal SEL connects to the D input of latch 300 via NAND gate 310. NAND gate 310 blocks the select signal if a state signal ST2b from the identical clock-state generator 220 (FIG. 2) is logic zero, meaning clock signal CLK2 is selected. Assuming clock signal CLK2 is not selected, and that signal ST2b is therefore a logic one, NAND gate 310 passes an inverted version of select signal SEL1 to the D input of latch 300. XOR gate 340 merely passes clock signal CLK1 when signal LCI is logic zero. In that case, the first falling edge of clock signal CLK1 following the transition of select signal SEL triggers latch 300, causing latch output Qb to transition to a logic one. If clock-enable signal CEN is asserted, NAND gate 320 passes the rising edge on the output of latch 300 as a falling edge on the D input of latch 305. A falling edge on the clock input of latch 305, brought on by a subsequent falling edge on clock signal CLK1, then latches the logic zero on the data terminal D of latch 305 so that respective output node Qb goes high. Inverter 330 receives the output of latch 305 and consequently asserts state signal ST1b. As noted above in connection with FIG. 2, asserting state signal ST1b causes multiplexer 205 to pass clock signal CLK1. Returning select signal SEL1 to logic zero returns state signal ST1b to a logic one, again after a falling edge of clock signal CLK1, and consequently causes multiplexer 205 to disconnect clock signal CLK1.

Clock enable signal CEN1, one of the inputs of NAND gate 320, separates latches 300 and 305. Clock enable signal CEN1 thus selectively disconnects the output of latch 300 from the input of latch 305, allowing external, synchronous starting and stopping of clock signal CLK1.

Asserting clock-ignore signal CIG1 renders each of latches 300 and 305 transparent. Assuming clock-enable signal CEN1 and state signal ST1b are each at logic one when clock-ignore signal CIG1 is asserted, the logic level on select signal SELL alters the contents of latches 300 and 305 as discussed above without awaiting clock edges on the clock terminals of latches 300 and 305. De-asserting select-signal SEL1, for example, asynchronously sets node Qb of latch 300 to logic zero and, consequently, node Qb of latch 305 to logic zero. Enabling latches 300 and 305 to switch states in response to select signal SELL in the absence of a clock signal allows control circuit 200 to switch away from a failed clock.

Figure 4:
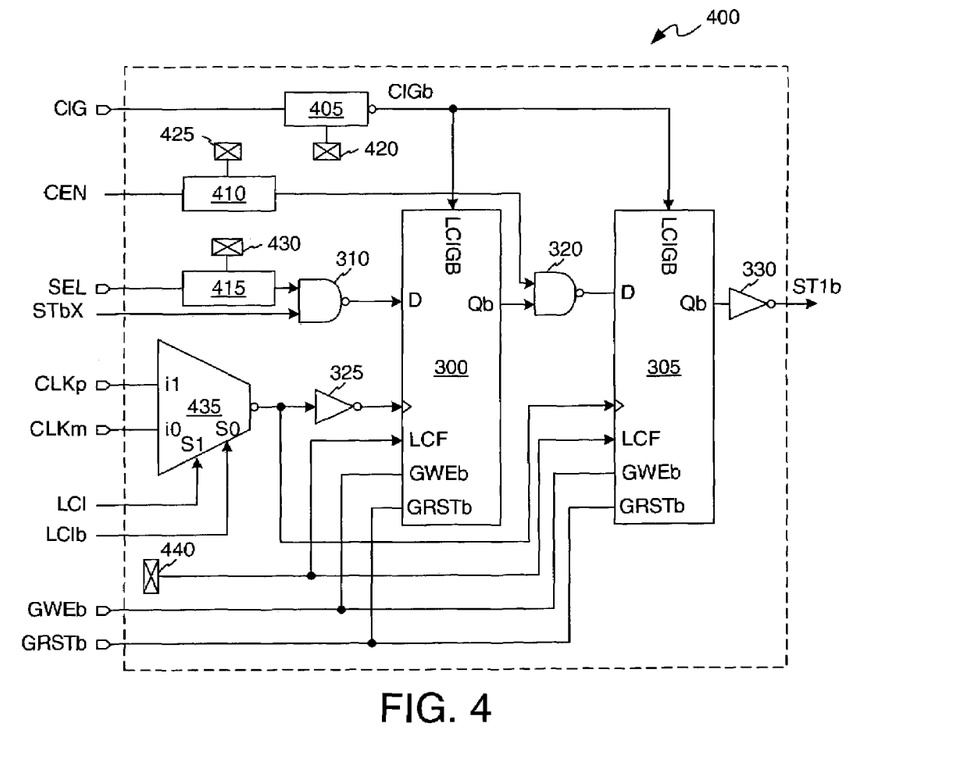
FIG. 4 details a clock-state generator in accordance with one embodiment.

FIG. 4 details a clock-state generator 400, an instance of which is used in place of each clock-state generator 215 and 220 in an embodiment of the present invention. Clock-state generator 400 uses differential clock signals (e.g., clock signal CLK1 is made up of differential half signals CLKp and CLKm). State generator 400 is in many ways comparable to state generator 215 of FIG. 3, like-named elements being the same or similar.

Three configurable inverters 405, 410, and 415 provide flexibility by allowing the user to optionally invert the sense of each of control signals CIG, CEN, and SEL. These inverters are controlled by respective memory cells 420, 425, 430, each an SRAM cell in one embodiment.

A multiplexer 435 receives differential clock signals CLKp and CLKm, providing one or the other in response to complementary signals LCI and LCIb, and consequently determining which one of differential-clock signals CLKm and CLKp triggers latches 300 and 305. Circuit 400 is negative-edge triggered when signal LCI is a logic zero. Latch 300 transmits a signal Qb complementary to the signal on its data terminal D when the output of multiplexer 435 transitions to a logic one, and latch 305 transmits a respective signal Qb complementary to the signal on its respective data terminal D when the output of multiplexer 435 transitions to a logic zero.

Each of latches 300 and 305 includes terminals in addition to those discussed in connection with FIG. 3. A latch-configure terminal LCF connects to a latch-configure-memory cell 440, a global-write-enable terminal GWEb receives a global-write-enable signal GWEb, and a global-reset terminal GRSTb receives a global reset signal GRSTb. Latch-configure memory cell 440 can be configured to pre-select one of clock signals CLK1 or CLK2 for transmission when global-reset signal GRSTb is asserted (low). When signal GRSTb is de-asserted (high), the control of circuit 200 reverts back to the select and clock-enable signals.

Clock-state generator 400 is adapted for use in a programmable logic device in which a global-write-enable signal GWEb is de-asserted (high) during configuration or reconfiguration. Signal GWEb, being high, renders latches 300 and 305 insensitive to respective control signals, holding latches 300 and 305 in their current states when asserted. If signal LCF is logic zero, global-reset signal GRSTb sets latches 300 and 305 to transmit logic zeroes on their respective Qb output terminals.

Figure 5:
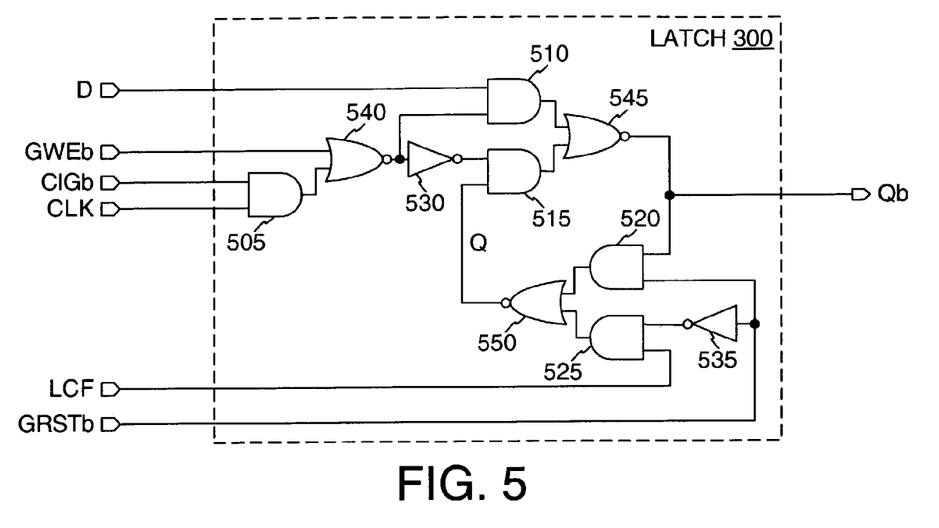
FIG. 5 details an embodiment of latch of FIG. 3.

FIG. 5 details an embodiment of latch 300 of FIG. 3. Latch 300 includes five AND gates 505, 510, 515 520, and 525; a pair of inverters 530 and 535; and three NOR gates 540, 545, and 550. Latch 305 is identical to latch 300, so a detailed discussion of latch 305 is omitted for brevity.

Latch 300 operates in four modes: reset, normal, ignore, lock, as directed by global-reset signal GRSTb, clock-ignore signal CIGb, and global-write-enable signal GWEb. Table 2 below summarizes these four operational modes and the logic states of the requisite control signals.

TABLE 2

| MODE | GWEb | CIGb | GRSTb | Qb |
|---|---|---|---|---|
| Reset | 1 | 1 | 0 | 0 if LCF = 0 |
|  |  |  |  | 1 if LCF = 1 |
| Normal | 0 | 1 | 1 | Db after CLK |
| Ignore | 0 | 0 | 1 | Db async. |
| Lock | 1 | X | 1 | Maintain state |

Global reset signal GRSTb is briefly asserted (low) while global write enable signal GWEb is de-asserted (high). Asserting global-reset signal GRSTb prevents control signals CIGb, CEN, and SEL from affecting circuit 200. Global-reset signal GRSTb also resets latch 300, setting output signal Qb to a logic zero if signal LCF is a logic zero and to a logic one if signal LCF is a logic one (Table 2, line 1). Signal LCF (and the similar signal in latch 305) thus allows latch 300 to pre-select a respective clock signal, if desired.

When GWEb is high, a logic zero from NOR gate 540 prevents AND gate 510 from passing data signal D and allows AND gate 515 to pass the output of NOR gate 550. Asserting GRSTb then disables AND gate 520 and enables AND gate 525 to allow signal LCF to dictate the value of the Qb output of latch 300.

In the normal mode (Table 2, line 2), signal GWEb is asserted (low) and signals CIGb and GRSTb are all de-asserted (high). Latch 300 transmits the complement Db of data signal D after a falling edge on clock signal CLK (Table 2, line 2). The following discussion assumes latch 300 is set and signal LCF is a logic zero prior to entering the normal mode.

A logic one transition on global-reset signal GRSTb, inverted by inverter 535, prevents AND gate 525 from passing signal LCF and allows AND gate 520 to pass the output of NOR gate 545 to NOR gate 550. The output of NOR gate 550 (i.e., terminal "Q") thus transitions to the complement of output terminal Qb. The clock signal CLK, data signal D, and signal Q determine the output of NOR gate 545. For example, a logic zero transition on data terminal D disables AND gate 510, which in turn enables NOR gate 545 to be controlled by clock signal CLK. The output of NOR gate 545 then transitions from a logic one to a logic zero in response to a subsequent logic zero on clock terminal CLK. Recalling that signal GRSTb is a logic one, the output of AND gate 520 goes high with node Qb, causing NOR gate 550 to produce a logic zero. AND gate 515 is thus prevented from passing further clock edges from inverter 530. Both of AND gates 510 and 515 then transmit logic zeroes to NOR gate 545, maintaining node Qb at logic one.

Asserting clock-ignore signal CIGb places latch 300 in the "ignore" mode, in which latch 300 is transparent (Table 2, line 3). A logic zero transition on signal CIGb disables AND gate 505 from passing clock signal CLK, causing NOR gate 540 to transmit a logic one to AND gate 510 and inverter 530. AND gate 510 then passes data signal D to NOR gate 545, and inverter 530 produces a logic zero which disables AND gate 515, which in turn, transmits a logic zero to NOR gate 545. The output of latch 300 is therefore the complement of data D, and transitions in response to changes on data terminal D without waiting for a clock edge.

Finally, de-asserted global-write-enable signal GWEb transitions latch 300 to a lock mode (Table 2, line 4). In this mode, latch 300 does not respond to transitions on clock signal CLK or data signal D; instead, latch 300 maintains the current state of output signal Qb as long as signal GWE is asserted. Signal GRSTb is asserted (low) in this embodiment to restore latch 300.

Figure 6:
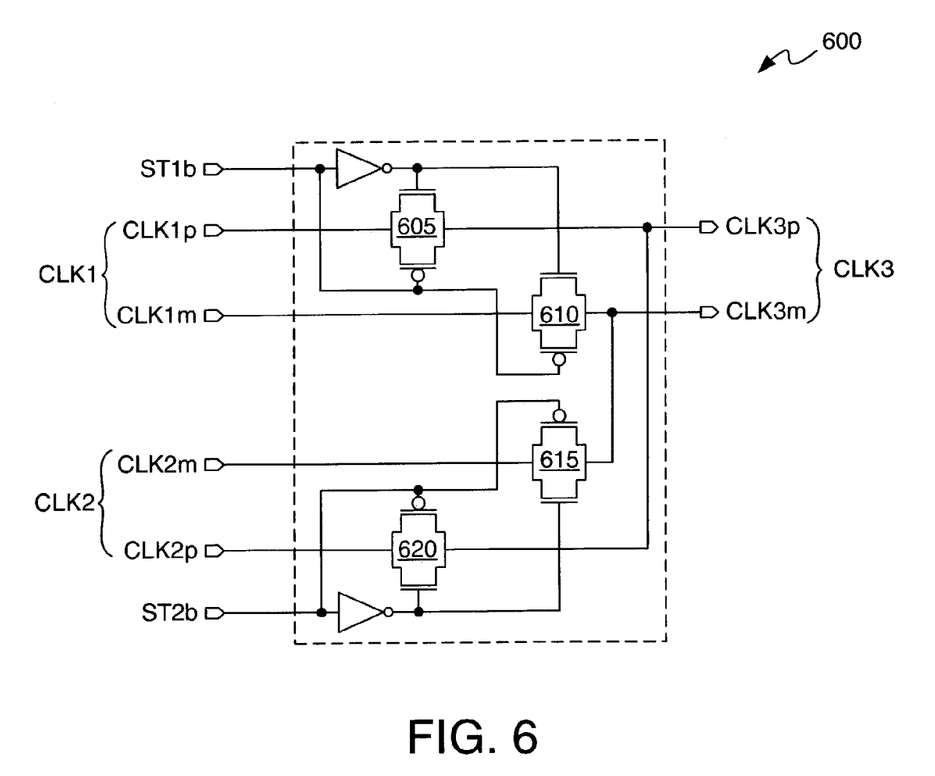
FIG. 6 details a multiplexer used in place of multiplexer of FIG. 2.

FIG. 6 details a multiplexer 600 used in place of multiplexer 205 in an embodiment in which clock-control circuit 200 is adapted for use with differential clock signals (e.g., CLK1=CLK1p/CLK1m and CLK2=CLK2p/CLK2m). Multiplexer 600 is in many ways comparable to multiplexer 205 of FIG. 2, like-named elements being the same or similar.

State transition signals ST1b and ST2b control whether nodes CLK3p/CLK3m are connected to first clock signal CLK1p/CLK1m, second clock signals CLK2p/CLK2m, or neither. Transmission gates 605 and 610 turn on when state signal ST1b is a logic zero, connecting first differential clock signal CLK1p/CLK1m to corresponding nodes CLK3p/CLK3m. Transmission gates 615 and 620 turn on when state signal ST2b is a logic zero, connecting second differential clock signal CLK2p/CLK2m to corresponding nodes CLK3p/CLK3m. As discussed earlier with respect to FIG. 2, state signals ST1b and ST2b may both be logic one, in which case both input clock signals are disconnected from nodes CLK3p and CLK3m. State signals ST1b and ST2b may not simultaneously transition to logic zero, in this embodiment, as this condition would short the two input clock signals.

Figure 7:
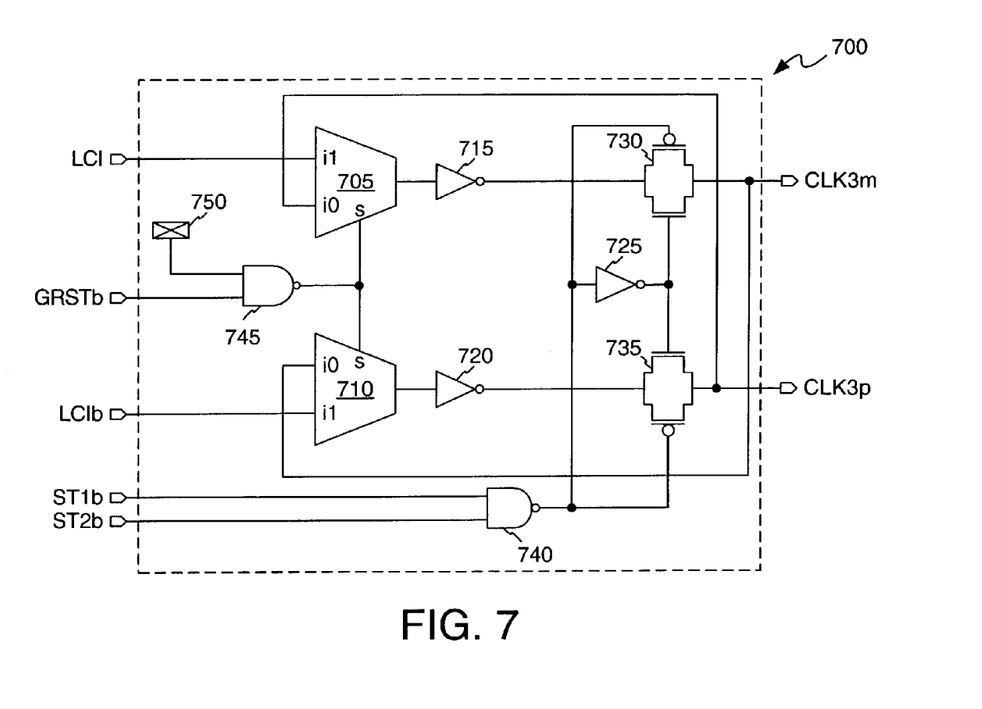
FIG. 7 details a hold circuit used in place of hold circuit of FIG. 2.

FIG. 7 details a hold circuit 700 used in place of hold circuit 225 in an embodiment in which clock-control circuit 200 is adapted for use with differential clock signals (e.g., CLK1=CLK1p/CLK1m and CLK2=CLK2p/CLK2m). Circuit 700 includes multiplexers 705 and 710, inverters 715, 720, and 725, transmission gates 730 and 735, and NAND gates 740 and 745. A logic bit stored in a memory cell 750 determines whether circuit 700 forces the values of signals LCI and LCIb on respective nodes CLK3m and CLK3p or simply maintains the output nodes in their current logic state when state signals ST1b and ST2b are logic one. If memory cell 750 is programmed to store a logic one and the previously selected clock stops when node CLK3p is at the logic value of signal LCIb, then signal nodes CLK3m and CLK3p are forced to the respective values of signals LCIb and LCI. These signal transitions generate clock edges on nodes CLK3m and CLK3p.

When memory cell 750 and global-reset signal GRSTb both provide logic ones, hold circuit 700 is a cross-coupled latch that maintains the current logic state of nodes CLK3m and CLK3p. When memory cell 750 is a logic zero or global-reset signal GRSTb is asserted, NAND gate 745 causes multiplexers 705 and 710 to convey complementary signals LCI and LCIb to respective transmission gates 730 and 735 via inverters 715 and 720. Then, when state signals ST1b and ST2b both transition to logic one, signals LCI and LCIb drive respective nodes CLK3m/CLK3p to logic states that are complementary to respective signals LCI and LCIb. Recall that latch-clock-invert signals LCI/LCIb determine whether clock control circuit 200 is positive- or negative-edge triggered. If positive-edge triggered, then hold circuit 700 should hold output terminals CLK3m/CLK3p at a logic zero during transitions. To this end, hold circuit 700 maintains output nodes CLK3m and CLK3p at the inverse of signals LCI and LCIb when state signals ST1b and ST2b are both one.

Maintaining output nodes CLK3m and CLK3p at the inverse of signals LCI and LCIb when in state 11 (i.e., ST1b=1 and ST2b=1) is important for two reasons. First, when clock-control circuit 200 is positive-edge triggered, asserting (de-asserting) a select signal connects (disconnects) the selected clock when the clock is in a logic zero state. Hold circuit 700 therefore holds the output terminals in a logic zero state when neither input clock is selected to avoid introducing a glitch on the output. Second, if a selected clock fails in the wrong state, e.g., stops in a logic one state when signal LCI is a logic one, hold circuit 700 brings output nodes CLK3m/CLK3p to levels representative of a logic zero to provide a glitch-free transition from the hold-state to the next clock signal.

Figure 8:
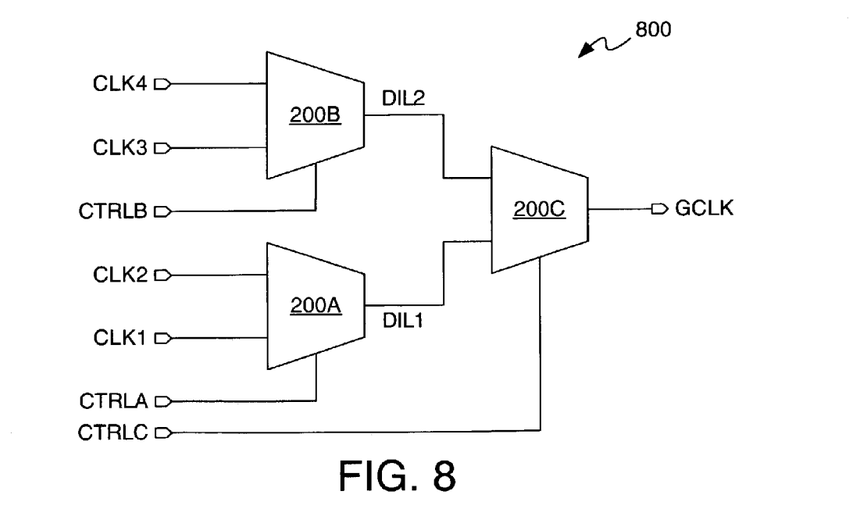
FIG. 8 depicts a circuit that implements a four-to-one multiplexing using three clock-control circuits.

FIG. 8 depicts a clock-control circuits 800 made up of three instances 200A, 200B, and 200C of clock-control circuit 200 of FIG. 2. Circuit 800 includes dedicated lines DIL1 and DIL2 and multiplexers (not shown) that programmably connect the output of respective instances 200A and 200B to the input terminals of instance 200C. In an embodiment instantiated on a field-programmable gate array, collections of clock-control circuits can be programmably connected in this manner to form larger dynamic clock-control circuits. In the depicted embodiment, circuit 800 selectively connects one of four clock signals CLK1–4 to output node GCLK. A respective control bus CTRLA-CTRLC controls each control circuit 200A–C, each having signals that are identical to the control signals of circuit 200. This enables the building of larger (e.g., 4:1, 8:1, or 16:1) dynamic clock multiplexers out of control circuits analogous to circuit 200 of FIG. 2.

Figure 9:
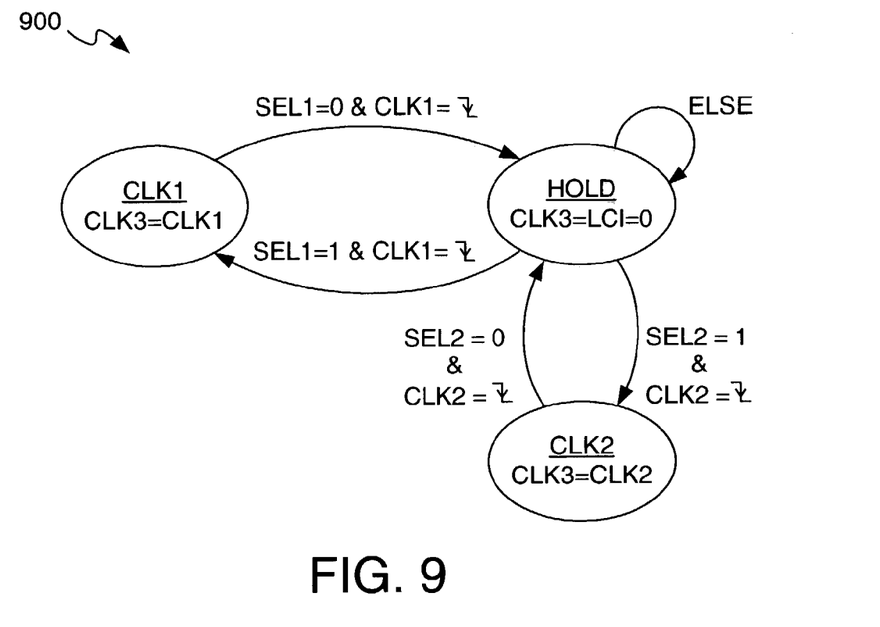
FIG. 9 is a state diagram illustrating the operation of clock-control circuit of FIG. 2.

FIG. 9 is a state diagram 900 illustrating the operation of clock-control circuit 200 of FIG. 2. Circuit 200 supports the following three states:

1. State CLK1—multiplexer 205 provides input clock CLK1 on output node CLK3 (CLK3=CLK1);
2. State Hold—hold circuit 225 holds output node CLK3 at the LCI level (CLK3=LCI); and
3. State CLK2—multiplexer 205 provides input clock CLK2 on output node CLK3 (CLK3=CLK2).

When latch-clock invert signal LCI is a logic zero, clock-control circuit 200 transitions from either clock state to the hold state, and vice versa, on a falling clock edge. When transitioning to or from state CLK1, clock signal CLK1 provides the requisite falling clock edge; similarly, when transitioning to or from state CLK2, clock signal CLK2 provides the requisite falling clock edge. The select signals SEL1 and SEL2 need not meet set-up or hold-time requirements: the set-up/hold point between the select signals and their respective clock edges determine whether a given state change occurs in one clock cycle or the next.

Figure 10:
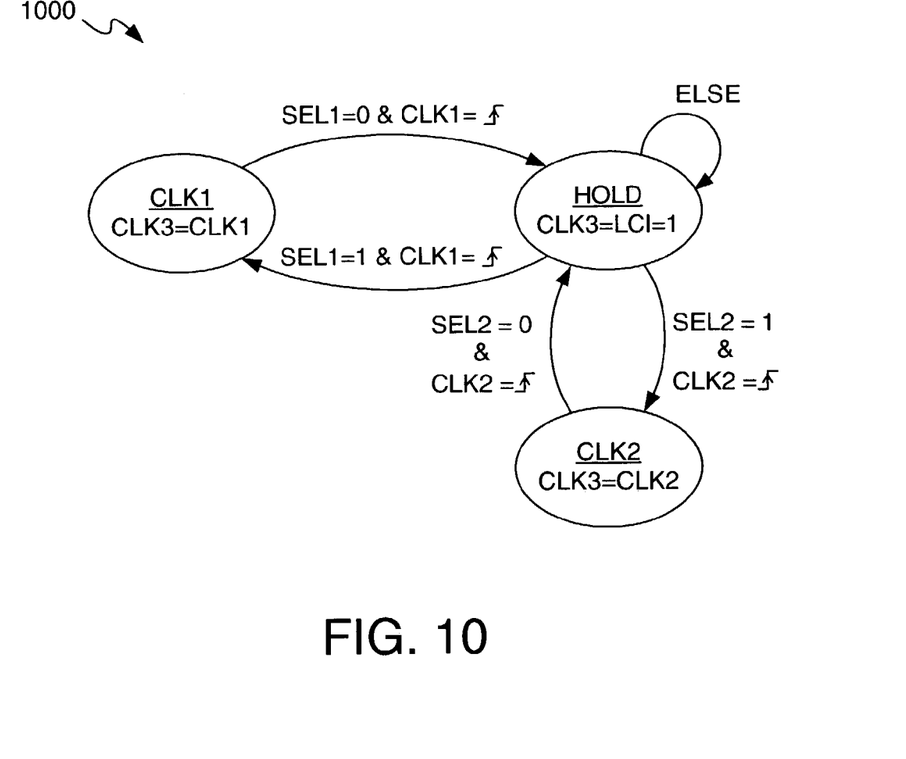
FIG. 10 is a state diagram similar to state diagram of FIG. 9, but illustrating the operation of clock-control circuit when signal LCI is a logic one.

FIG. 10 is a state diagram 1000 similar to state diagram 900 of FIG. 9, but illustrating the operation of clock-control circuit 200 when signal LCI is a logic one. In that case, clock-control circuit 200 transitions from either clock state to the hold state, and vice versa, on a rising clock edge and holds output node CLK3 to logic one in the hold state.

Figure 11:
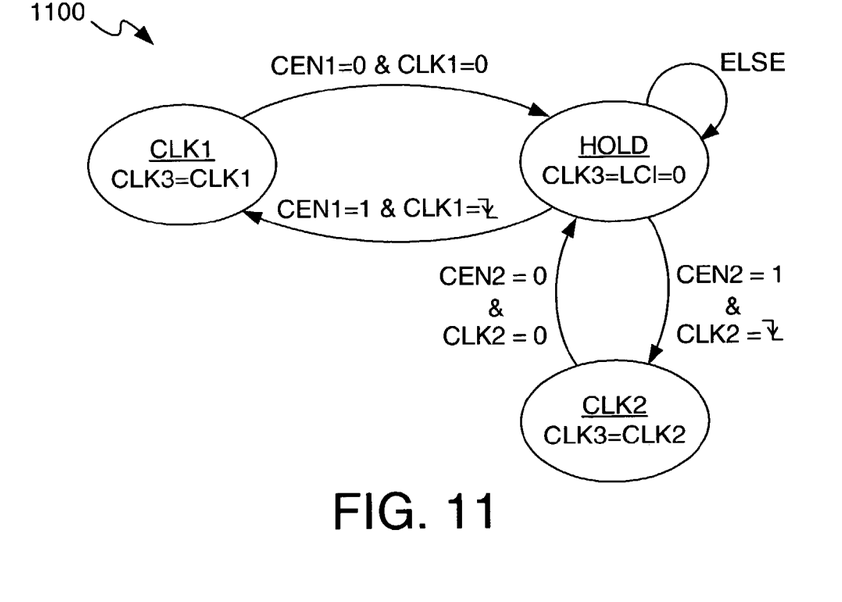
FIG. 11 is a state diagram illustrating the response of clock-control circuit to clock-enable signals CEN1 and CEN2 when signal LCI is a logic zero.

FIG. 11 is a state diagram 1100 illustrating the response of clock-control circuit 200 to clock-enable signals CEN1 and CEN2 when signal LCI is a logic zero. Clock-control circuit 200 transitions from the hold state to the clock state associated with an asserted clock-enable signal on a falling clock edge. If clock-enable signal CEN1 is asserted (CEN1=1) in the hold state, for example, circuit 200 transitions to state CLK1 on the next falling edge of clock signal CLK1. In a clock state, clock-control circuit 200 transitions to the hold state when the respective clock-enable signal is de-asserted and the selected clock signal is zero. Clock-enable signals CEN1 and CEN2 should meet the set-up and hold-time requirements of latches 305 to prevent glitches on output node CLK3. Clock-enable signals CEN1 and CEN2 can be used to select between clock signals CLK1 and CLK2 in lieu of select signals SEL1 and SEL2.

Figure 12:
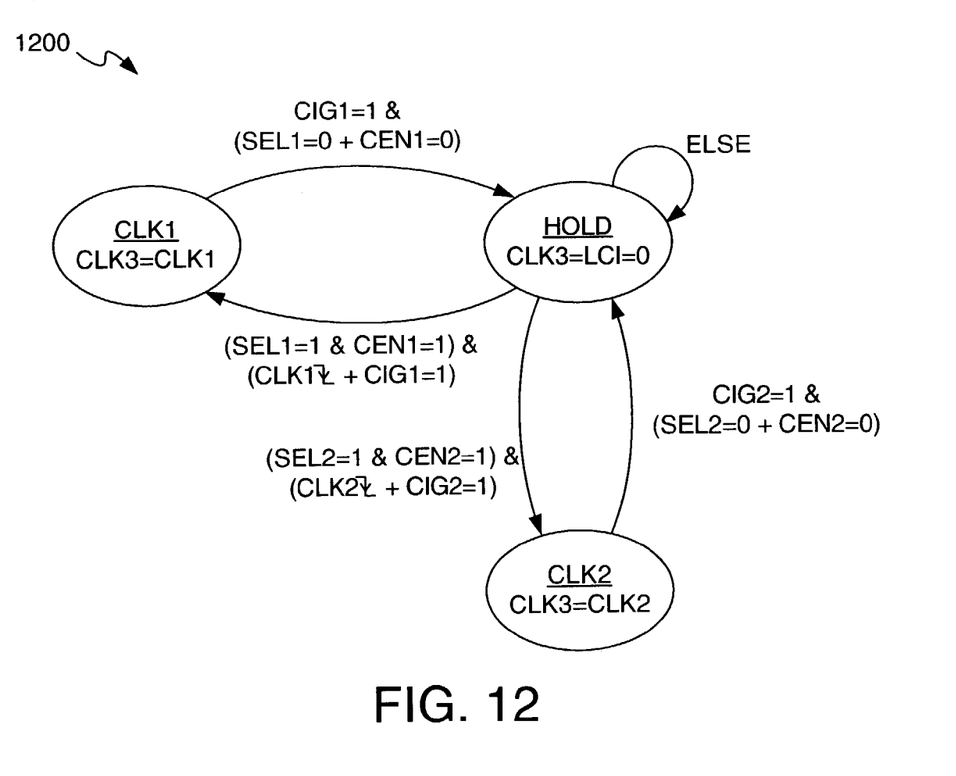
FIG. 12 is a state diagram 1200 illustrating the operation of clock-ignore signals CIG1 and CIG2 when signal LCI is a logic zero.

FIG. 12 is a state diagram 1200 illustrating the operation of clock-ignore signals CIG1 and CIG2 when signal LCI is a logic zero. Recall that the clock-ignore signals allow clock-control circuit 200 to switch away from a failed clock. This is accomplished by rendering latches 300 and 305 (FIG. 3) transparent so that their outputs are not clock dependent. Assuming diagram 1200 is in state CLK1, for example, and clock signal CLK1 has failed, asserting clock-ignore signal CIG1 allows clock-control circuit 200 to transition to the hold state when either select signal SELL or clock-enable signal CEN1 is de-asserted: the timing and level of clock signal CLK1 is irrelevant. Clock-control circuit 200 can then switch to a "good" clock signal in response to appropriate select and clock-enable signals. For example, clock-control circuit 200 can switch from the hold state to state CLK2 if both select signal SEL2 and clock-enable signal CEN2 are asserted. Switching away from an active clock using a clock-ignore signal can introduce glitches on the output.

The state diagrams of FIGS. 9 through 12 are illustrative and not limiting. One embodiment supports the superset of the diagrams of FIGS. 9 through 12. Other permutations of the various control signals facilitate other functionality, as will be evident to those of skill in the art.

While the present invention has been described in connection with specific embodiments, variations of these embodiments will be obvious to those of ordinary skill in the art. For example, embodiments of the invention can be adapted to include a clock monitoring circuit that automatically generates the appropriate control signals to switch away from a failed clock. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Also, unless otherwise defined, terminals, lines, conductors, and traces that carry a given signal fall under the umbrella term "node"; in general, the choice of a given description of a circuit node is a matter of style, and is not limiting. Furthermore, only those claims specifically reciting "means for" or "step for" should be construed in the manner required under the sixth paragraph of 35 U.S.C. section 112. Therefore, the spirit and scope of the appended claims should not be limited to the foregoing description.

What is claimed is:

1. A clock-control circuit comprising:
    a first input terminal receiving a first clock signal;
    a second input terminal receiving a second clock signal;
    a select terminal receiving a select signal;
    a clock-enable terminal receiving a clock-enable signal; and
    a clock-distribution node transmitting the first clock signal when the select signal is in a first select state and the clock-enable signal is asserted;
    wherein in a first mode, the clock-control circuit stops transmitting the first clock signal synchronously with the first clock signal, and in a second mode, the clock-control circuit stops transmitting the first clock signal asynchronously with the first clock signal.

2. The clock-control circuit of claim 1, wherein the clock-control circuit provides a predefined output signal on the clock-distribution node when neither the first nor the second clock signals is selected.

3. The clock-control circuit of claim 1, further comprising a second clock-enable terminal receiving a second clock-enable signal, wherein the clock-distribution node transmits the second clock signal when the select signal is in a second select state and the second clock-enable signal is asserted.

4. The clock-control circuit of claim 3, wherein the clock-control circuit synchronously starts transmitting the second clock signal when the second clock-enable signal is asserted.

5. The clock-control circuit of claim 1, wherein at least one of the first and second clock signals is a differential half signal.

6. A clock-control circuit comprising:
    a first input terminal receiving a first clock signal;
    a second input terminal receiving a second clock signal;
    a multiplexer having a first multiplexer input terminal receiving the first clock signal, a second multiplexer input terminal receiving the second clock signal, and a multiplexer output terminal, wherein the multiplexer conveys the first clock signal on the multiplexer output terminal in a first select state and conveys the second clock signal on the multiplexer output terminal in a second select state; and
    a hold circuit connected to the multiplexer output terminal, the hold circuit holding the multiplexer output terminal at a predefined logic level in a third select state, wherein when the clock-control circuit switches from the first clock signal to the second clock signal, the predefined logic level is held until the second clock signal has the predefined logic level.

7. The clock-control circuit of claim 6, wherein the predefined logic level is configurable.

8. A clock-control circuit conveying a distributed differential clock signal, the clock-control circuit comprising:
    control logic having:
    a plurality of control terminals receiving a corresponding plurality of control signals, including a clock-ignore signal; and
    at least one state terminal providing a state signal responsive to a state of a plurality of states;
    wherein the control logic defines the plurality of states, including at least first and second states, in response to the control signals; and
    a clock multiplexer having:
    at least one select terminal connected to the state terminal;
    first differential input terminals receiving a first differential clock signal;
    second differential input terminals receiving a second differential clock signal; and
    differential output terminals transmitting the first differential clock signal in the first state or the second differential clock signal in the second state, depending, at least in part, upon the state signal, wherein the control logic ignores a selected one of the first and second differential clock signals in response to the clock-ignore signal.

9. The clock-control circuit of claim 8, wherein the control logic further includes a hold circuit further comprising a hold circuit connected to the clock-differential output terminals, the hold circuit holding the differential output terminals at a predefined logic level in a third state.

10. The clock-control circuit of claim 8, further comprising a clock-enable terminal receiving a clock-enable signal, wherein the clock-control circuit enters a third state when the clock-enable signal is deasserted, and wherein the multiplexer stops transmitting a selected one of the first and second differential clock signals in the third state.

11. The clock-control circuit of claim 8 wherein said control logic further includes a programmable logic device.

12. A clock selection circuit adapted to select between a first clock signal and a second clock signal at an output node, the clock selection circuit comprising:
   a control circuit coupled to receive a select signal and adapted to assert a clock deselect signal in response to a falling edge of the first clock signal during a first phase of operation and adapted to assert the clock deselect signal in response to the select signal independent of a value of the first clock signal during a second phase of operation; and
   a multiplexer coupled to receive the clock deselect signal and adapted to switch from the first clock signal to the second clock signal in response to the clock deselect signal.

13. The clock selection circuit according to claim 12, wherein the control circuit comprises a latch coupled to receive a clock-ignore signal and adapted to synchronously pass the select signal in response to a first logic value of the clock-ignore signal during the first phase of operation and adapted to asynchronously pass the select signal in response to a second logic value of the clock-ignore signal during the second phase of operation.

14. The clock selection circuit according to claim 13, wherein the control circuit further comprises a hold circuit adapted to maintain a constant logic value at the output node during a transition between selecting the first clock signal and selecting the second clock signal.

15. A method of selecting between first and second clock signals, the method comprising:
   supplying the first clock signal to an output node;
   asserting a clock deselect signal to switch between the first clock signal and the second clock signal;
   in a first phase of operation, replacing the first clock signal with the second clock signal in response to receiving a falling edge of the first clock signal subsequent to asserting the clock deselect signal; and
   in a second phase of operation, replacing the first clock signal with the second clock signal in response to asserting the clock deselect signal independent of a value of the first clock signal.

16. The method according to claim 15, wherein the first phase of operation comprises activating a latch circuit to detect the falling edge of the first clock signal.

17. The method according to claim 16, wherein the second phase of operation comprises deactivating the latch circuit to ignore the falling edge of the first clock signal.

18. The method according to claim 15, further comprising maintaining the output node at a constant logic level when switching between the first clock signal and the second clock signal.

\* \* \* \* \*